United States Patent
Li et al.

(10) Patent No.: US 9,859,350 B2
(45) Date of Patent: Jan. 2, 2018

(54) ARRAY SUBSTRATE, FABRICATION METHOD THEREOF AND DISPLAY DEVICE

(71) Applicant: BOE TECHNOLOGY GROUP CO., LTD., Beijing (CN)

(72) Inventors: Yongqian Li, Beijing (CN); Longyan Wang, Beijing (CN); Cuili Gai, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/021,459

(22) PCT Filed: Aug. 12, 2015

(86) PCT No.: PCT/CN2015/086707
§ 371 (c)(1),
(2) Date: Mar. 11, 2016

(87) PCT Pub. No.: WO2016/169158
PCT Pub. Date: Oct. 27, 2016

(65) Prior Publication Data
US 2016/0315131 A1    Oct. 27, 2016

(30) Foreign Application Priority Data

Apr. 24, 2015    (CN) .......................... 2015 1 0201226

(51) Int. Cl.
*H01L 29/08*    (2006.01)
*H01L 21/00*    (2006.01)
(Continued)

(52) U.S. Cl.
CPC ...... *H01L 27/3258* (2013.01); *H01L 27/3262* (2013.01); *H01L 27/3265* (2013.01);
(Continued)

(58) Field of Classification Search
CPC ............. H01L 27/3258; H01L 27/3248; H01L 27/3276; H01L 51/5265; H01L 51/5218;
(Continued)

(56) References Cited

U.S. PATENT DOCUMENTS 7,990,050 B2 *  8/2011   Eom ................... H01L 51/5234
                                                                      313/504
8,334,545 B2    12/2012  Levermore et al.
(Continued)

FOREIGN PATENT DOCUMENTS

CN    103144037 A    6/2013
CN    103515544 A    1/2014
(Continued)

OTHER PUBLICATIONS

Search Report and Written Opinion dated Jan. 18, 2016 from State Intellectual Property Office of the P.R. China.
First Chinese Office Action dated May 24, 2017.

*Primary Examiner* — Thinh T Nguyen
(74) *Attorney, Agent, or Firm* — Dilworth & Barrese, LLP.; Michael J. Musella, Esq.

(57) ABSTRACT

An array substrate of an organic light-emitting display device, a fabrication method thereof and an organic light-emitting display device are provided. The array substrate comprises a plurality of pixel units arranged in array, wherein, at least one of the pixel units includes: an organic light-emitting diode (40) and a first thin film transistor (20) for controlling the organic light-emitting diode (40) which are formed on a base substrate (10), wherein, the organic light-emitting diode (40) includes a first electrode (107), a second electrode (110) and a light-emitting layer (109) located between the first electrode (107) and the second electrode (110), the first electrode (107) of the organic light-emitting diode (40) being connected with a drain electrode (104) of the first thin film transistor (20); and a
(Continued)

conductive layer (111) and an insulating layer (112) formed between the first thin film transistor (20) and the organic light-emitting diode (40), wherein, the first electrode (107) of the organic light-emitting diode (40), the insulating layer (111) and the conductive layer (112) form a capacitor, and the conductive layer (111) is connected with a first gate electrode (100) of the first thin film transistor (20). The array substrate of the organic light-emitting display device, the fabrication method thereof and the organic light-emitting display device can effectively increase a storage capacitance value of a pixel unit, so as to improve display quality.

20 Claims, 5 Drawing Sheets

(51) Int. Cl.
  *H01L 27/32* (2006.01)
  *H01L 51/52* (2006.01)
  *H01L 29/786* (2006.01)
(52) U.S. Cl.
  CPC .... *H01L 29/7869* (2013.01); *H01L 29/78648* (2013.01); *H01L 51/5265* (2013.01); *H01L 51/5218* (2013.01); *H01L 2251/5315* (2013.01); *H01L 2251/558* (2013.01)
(58) Field of Classification Search
  CPC ........... H01L 29/78648; H01L 29/7869; H01L 27/3262; H01L 51/558; H01L 2251/558; H01L 2251/305

USPC ......... 257/40, 59, 72, 462, E51.022; 438/82, 438/99, 48, 128

See application file for complete search history.

(56) References Cited

U.S. PATENT DOCUMENTS

| | | | |
|---|---|---|---|
| 9,012,900 B2* | 4/2015 | Beak | H01L 27/3265 |
| | | | 257/40 |
| 9,076,983 B2* | 7/2015 | Kim | H01L 51/5212 |
| 2003/0141811 A1 | 7/2003 | Park | |
| 2003/0214691 A1* | 11/2003 | Magno | H01L 27/3211 |
| | | | 313/498 |
| 2010/0052517 A1 | 3/2010 | Kim | |
| 2011/0175102 A1* | 7/2011 | Hatano | H01L 51/5243 |
| | | | 257/72 |
| 2014/0175393 A1* | 6/2014 | Beak | H01L 27/3246 |
| | | | 257/40 |
| 2014/0191202 A1 | 7/2014 | Shim et al. | |
| 2014/0239262 A1* | 8/2014 | Kim | H01L 51/5212 |
| | | | 257/40 |
| 2016/0274693 A1* | 9/2016 | Liu | G06F 3/044 |

FOREIGN PATENT DOCUMENTS

| | | |
|---|---|---|
| CN | 103904099 A | 7/2014 |
| CN | 103915577 A | 7/2014 |
| CN | 104022136 A | 9/2014 |
| CN | 104157678 A | 11/2014 |
| CN | 104505397 A | 4/2015 |

* cited by examiner

ARRAY SUBSTRATE, FABRICATION METHOD THEREOF AND DISPLAY DEVICE

TECHNICAL FIELD

Embodiments of the present disclosure relate to an array substrate of an organic light-emitting display device, a fabrication method thereof and an organic light-emitting display device.

BACKGROUND

An Organic Light-Emitting Display (OLED) device is becoming a main development direction of new display device, due to advantages such as self-illumination, fast response, wide viewing angle and ability to be fabricated on a flexible substrate.

For an OLED product of high resolution, because a Pixels Per Inch (PPI) thereof is too high and the pixel requires a plurality of TFTs to serve as a compensation circuit, the pixel does not have sufficient storage capacitance. For example, the pixels are evaluated by a resolution of 8.5-inch WUXGA (2560*1600), and the pixel has the storage capacitance of only 50 fF in a common array technology. However, in order to maintain stability of a pixel voltage, a leakage current of $1\times e^{-13}$ to $1\times e^{-14}$ ampere is needed to maintain a voltage change of a grayscale in a frame time, and therefore, it is very important to increase the storage capacitance.

SUMMARY

An embodiment of the present disclosure provides an array substrate of an organic light-emitting display device, comprising a plurality of pixel units arranged in array, wherein, at least one of the pixel units includes: an organic light-emitting diode and a first thin film transistor for controlling the organic light-emitting diode which are formed on a base substrate, wherein, the organic light-emitting diode includes a first electrode, a second electrode and a light-emitting layer located between the first electrode and the second electrode, the first electrode of the organic light-emitting diode being electrically connected with a drain electrode of the first thin film transistor; and a conductive layer and an insulating layer formed between the first thin film transistor and the organic light-emitting diode, wherein, the first electrode of the organic light-emitting diode, the insulating layer and the conductive layer form a capacitor, and the conductive layer is electrically connected with a first gate electrode of the first thin film transistor.

An embodiment of the present disclosure further provides an organic light-emitting display device, comprising the array substrate described above.

An embodiment of the present disclosure provides a fabrication method of an array substrate of an organic light-emitting display device, comprising: forming a first thin film transistor and an organic light-emitting diode in a pixel region on a base substrate, the pixel region being defined by a gate line and a data line; and forming a conductive layer and an insulating layer between the first thin film transistor and the organic light-emitting diode; wherein, the organic light-emitting diode includes a first electrode, a second electrode and a light-emitting layer located between the first electrode and the second electrode, the first electrode of the organic light-emitting diode being electrically connected with a drain electrode of the first thin film transistor; the first electrode of the organic light-emitting diode, the insulating layer and the conductive layer form a capacitor, and the conductive layer is electrically connected with a first gate electrode of the first thin film transistor.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the disclosure.

DETAILED DESCRIPTION

Figure 1:
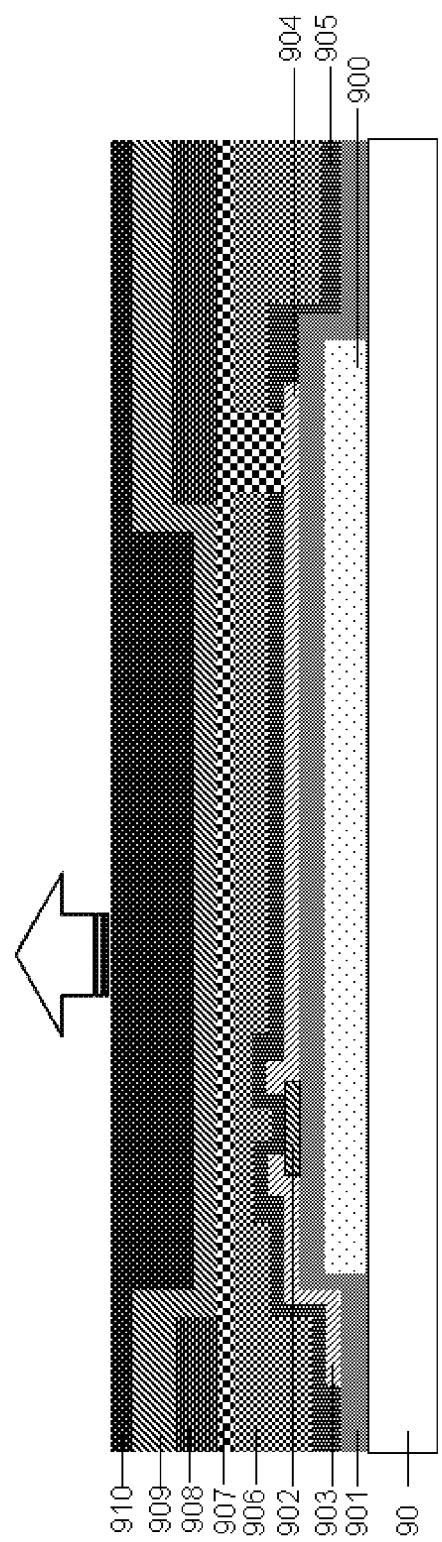
FIG. 1 is a partial cross-sectional structural schematic diagram of an array substrate of an organic light-emitting display device in a related art.

The technical solutions of the embodiments of the present disclosure will be described in a clearly and fully understandable way in connection with the drawings. It is obvious that the described embodiments are just a part but not all of the embodiments of the present disclosure. Based on the described embodiments herein, those skilled in the art can obtain other embodiment(s), without any inventive work, which should be within the scope of the present disclosure.

With reference to non-limitative exemplary embodiments shown in the drawings and described in the following, it is more comprehensively described the exemplary embodiments of the present disclosure and various features and favorable details thereof. It should be noted that, the features shown in the drawings are not necessarily drawn by scale. Descriptions of known materials, components and technologies are omitted, so as avoid blurring the exemplary embodiments of the present disclosure. The examples are only designed to facilitate understanding implementations of the exemplary embodiments of the present disclosure, and further help those skilled in the art to implement the exemplary embodiments. Therefore, the examples should not be understood as limitation to the scope of the exemplary embodiments of the present disclosure.

In a related art, an array substrate of an organic light-emitting display device comprises a plurality of pixel units arranged in array, and FIG. 1 shows a partial cross-sectional structure of a pixel unit thereof. As shown in FIG. 1, each of the pixel units includes an organic light-emitting diode formed on a base substrate 90 and a first thin film transistor for controlling the organic light-emitting diode. The first thin film transistor includes a gate electrode 900, a gate insulating layer 901, an active layer 902 and a source electrode 903/a drain electrode 904 which are sequentially stacked on a base substrate 90; the organic light-emitting diode is formed above the first thin film transistor, and includes an anode 907, an organic light-emitting layer 909 and a cathode 910. A first insulating layer 905 and a planarization layer 906 are formed between the organic light-emitting diode and the first thin film transistor, and the anode 907 of the organic light-emitting diode passes through the first insulating layer 905 and the planarization layer 906 to be electrically connected with the drain electrode 904 of the first thin film transistor.

It is found by the inventors that, in the array substrate of the organic light-emitting display device in the related art described above, a storage capacitance is provided by a capacitor formed by the gate electrode 900, the gate insulating layer 901, and the source electrode 903/the drain electrode 904. Due to limitation of space, it is difficult to effectively increase the storage capacitance to a desired value by changing an aspect ratio of the first thin film transistor. In addition, although an oxide thin film transistor represented by IGZO has relatively low leakage current in a structure of an etching stop layer (ESL), in a high PPI application, due to limitation of space, a TFT of back channel etching (BCE) structure must be used, and an oxide TFT of BCE structure usually has relatively high leakage current ($1\times e^{-11}$ to $1\times e^{-10}$, which cannot meet display requirements.

In this regard, the embodiments of the present disclosure provide an array substrate of the organic light-emitting display device, an organic light-emitting display device and a fabrication method of the array substrate of the organic light-emitting display device, capable of effectively increasing a storage capacitance value of a pixel unit and reducing a leakage current.

First Embodiment

Figure 2:
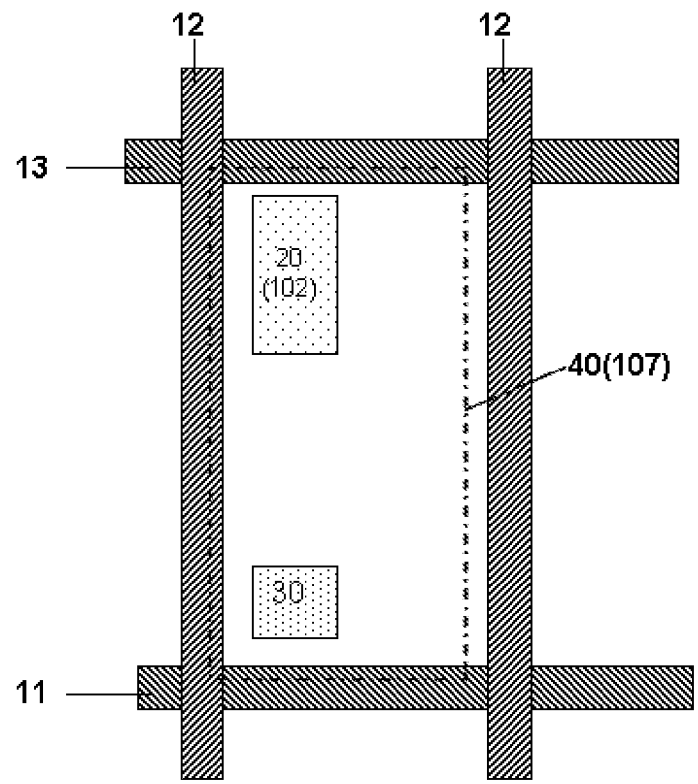
FIG. 2 is a partial planar structural schematic diagram of an array substrate of an organic light-emitting display device provided by a first embodiment of the present disclosure.
Figure 3:
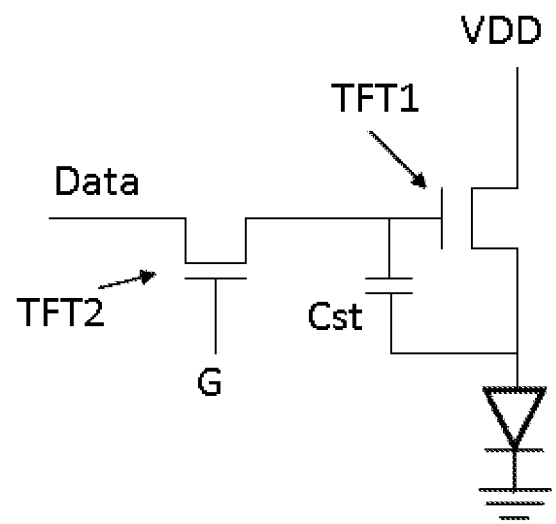
FIG. 3 is a pixel circuit diagram of a pixel unit in the array substrate shown in FIG. 2.
Figure 4:
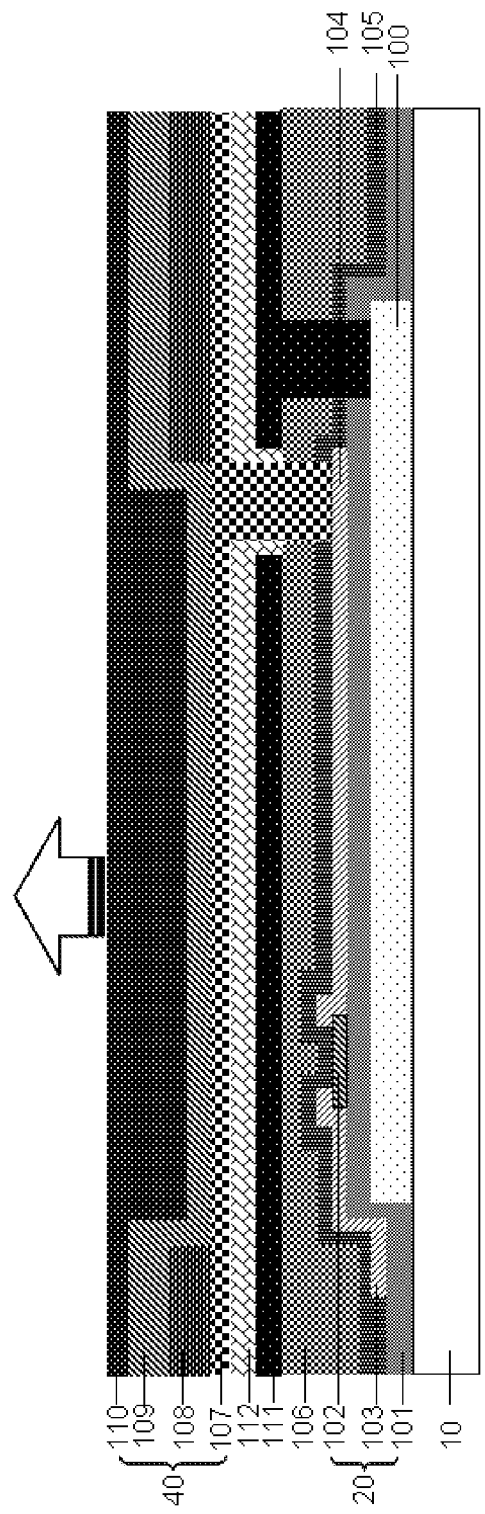
FIG. 4 is a partial cross-sectional structural schematic diagram of the array substrate of the organic light-emitting display device provided by the first embodiment of the present disclosure.

FIG. 2 is a partial planar structural schematic diagram of an array substrate of an organic light-emitting display device provided by a first embodiment of the present disclosure; FIG. 3 is a pixel circuit diagram of a pixel unit in the array substrate shown in FIG. 2; and FIG. 4 is a partial cross-sectional structural schematic diagram of the array substrate of the organic light-emitting display device provided by the first embodiment of the present disclosure. The organic light-emitting display device is an active matrix organic light-emitting display device.

Referring to FIGS. 2 to 4, an array substrate of an organic light-emitting display device provided by the first embodiment of the present disclosure comprises: a plurality of pixel units defined by gate lines 11, power lines 13 and data lines 12 on a base substrate 10 which intersect with one another horizontally and vertically. The base substrate 10 may be a glass substrate or a flexible substrate; the base substrate 10 may be a transparent substrate or an opaque substrate. In order to describe clearly and definitely, FIG. 2 and FIG. 4 only show a planar structure and a cross-sectional structure related to one pixel unit of the array substrate, and the other pixel units may be formed in a similar way. For example, each pixel unit may include a first thin film transistor 20 (also referred to as a driving thin film transistor) formed at an intersection of the power line 13 and the data line 12 to control the organic light-emitting display device, a second thin film transistor 30 (also referred to as a switching thin film transistor) formed at an intersection of the gate line 11 and the data line 12 to serve as an addressing component, and an organic light-emitting diode 40 formed above the first thin film transistor 20 and the second thin film transistor 30.

The first thin film transistor 20 includes a first gate electrode 100, a gate insulating layer 101, an active layer 102 and a source electrode 103/a drain electrode 104 which are sequentially stacked on a base substrate 10; the organic light-emitting diode 40 includes a first electrode (anode) 107, an organic light-emitting layer 109 and a second electrode (cathode) 110 stacked sequentially. In FIG. 2, the first thin film transistor 20 is shown by a range of the active layer 102 included therein; the second thin film transistor 30 is shown by a range of the active layer included therein; and the organic light-emitting layer 109 is shown by a range of the anode 107 included therein.

A gate electrode of the second thin film transistor 30 is electrically connected with the gate line 11, a source electrode of the second thin film transistor 30 is electrically connected with the data line 12, a drain electrode of the second thin film transistor 30 is electrically connected with the first gate electrode 100 of the first thin film transistor 20, and the source electrode 103 of the first thin film transistor 20 is electrically connected with the power line 13. In the embodiment, the first thin film transistor 20, for example, is an n type thin film transistor.

The pixel unit may further include a first insulating layer 105, a planarization layer 106, a conductive layer 111 and a second insulating layer 112, which are formed between the first thin film transistor 20 and the organic light-emitting diode 40. In the embodiment, the planarization layer 106, for example, is a resin layer, and has a thickness in a range of 1 to 2 microns. For example, the planarization layer 106 has a flat surface facing the conductive layer 111. Here, the conductive layer 111 may be made of a metal, a metal alloy or a transparent conductive oxide. The second insulating layer may be made of a material having a high dielectric constant such as $SiN_x$ or $Al_2O_3$. The second insulating layer 112 may be of a single-layer or multi-layer structure. The three of the conductive layer 111, the second insulating layer 112 and the anode 107 of the organic light-emitting diode 40 constitute a capacitor. The anode 107 of the organic light-emitting diode 40 may directly pass through the second insulating layer 112, the resin layer 106 and the first insulating layer 105 to be electrically connected with the drain electrode 104 of the first thin film transistor 20. In another example, the anode 107 of the organic light-emitting diode 40 may be also electrically connected with the drain electrode 104 of the first thin film transistor 20 through a via passing the second insulating layer 112, the resin layer 106 and the first insulating layer 105. The conductive layer 111 passes through the resin layer 106, the first insulating layer 105 and the gate insulating layer 102 to be electrically connected with the gate electrode 100 of the first thin film transistor 20. In another example, the conductive layer 111 may be electrically connected with the gate electrode 100 of the first thin film transistor 20 through a via passing the resin layer 106, the first insulating layer 105 and the gate insulating layer 102. The levels and positions of the conductive layer 111 and the second insulating layer 112 in the array substrate are not limited in the present disclosure, as long as the conductive layer 111 and the second insulating layer 112 can constitute a capacitor with the anode 107 of the organic light-emitting diode 40.

In the array substrate of the organic light-emitting display device provided by the first embodiment of the present disclosure, a storage capacitance of the pixel unit is formed by two parts: a first part of the storage capacitance is provided by a capacitor constituted by the first gate electrode 100, the gate insulating layer 101, the source electrode 103/the drain electrode 104, and a second part of the storage capacitance is provided by a capacitor constituted by the conductive layer 111, the second insulating layer 112 and the anode 107 of the organic light-emitting diode 40. Therefore, as compared with the array substrate of the organic light-emitting display device in the related art, the array substrate of the organic light-emitting display device provided by the first embodiment of the present disclosure has relatively high storage capacitance, so that the display quality of the organic light-emitting display device can be effectively improved.

In the above embodiment, the first thin film transistor 20 is arranged between the organic light-emitting diode 40 and the base substrate 10, but it should be understood that, in another embodiment, the organic light-emitting diode 40 may be arranged between the first thin film transistor 20 and the base substrate 10; in yet another embodiment, the first thin film transistor 20 and the organic light-emitting diode 40 may be arranged in different regions of the base substrate 10, that is, a vertical projection of the first thin film transistor 20 on the base substrate 10 does not overlap with a vertical projection of the organic light-emitting diode 40 on the base substrate 10.

In an example, the organic light-emitting display device provided by the first embodiment of the present disclosure, for example, is an organic light-emitting display device of top-emitting type, and as shown in FIG. 4, the hollow arrow denotes a light emergent direction. The conductive layer 111 may be made of, for example, a metal or a metal alloy.

In an example, the conductive layer 111 may cover the first thin film transistor 20 and at least a part of the data line 12, thus having a relative large area.

In an example, referring to FIG. 2, the conductive layer 111 and the anode 107 of the organic light-emitting diode 40 may have the same area, that is, they cover a whole region of the pixel unit. In another example, the conductive layer 111 may have an area less than that of the anode 107 of the organic light-emitting diode 40. That is, an outer edge of a vertical projection of the conductive layer 111 on the base substrate 10 does not exceed an outer edge of a vertical projection of the anode 107 of the organic light-emitting diode 40 on the base substrate 10.

Therefore, in the array substrate of the organic light-emitting display device provided by the first embodiment of the present disclosure, the storage capacitance of the pixel unit is mainly provided by the capacitor formed by the conductive layer 111, the second insulating layer 112 and the anode 107 of the organic light-emitting diode 40; a thickness of the gate insulating layer 101 between the gate electrode 100 and the source electrode 103/the drain electrode 104 can be designed more flexibly, and may be designed to be thicker to reduce parasitic capacitance, so there is relatively large space for adjusting characteristics of the first thin film transistor.

In a case that the array substrate of the organic light-emitting display device according to the embodiment of the present disclosure has a high PPI and adopts the driving thin film transistor of back channel etching structure, the pixel unit has relatively large storage capacitance and small leakage current, so that the display quality can be improved.

In an example, the anode 107 of the organic light-emitting diode 40, the second insulating layer 112 and the conductive layer 111 form an optical resonant micro-cavity configured to generate a resonant enhancement for light having a wavelength of $\lambda$ emitted by the organic light-emitting diode, and thus a luminous efficiency of the organic light-emitting diode may be improved.

For example, the conductive layer 111 is made of a metal or an alloy; the second insulating layer 112 has a refractive index n1 in a range of 1.4 to 1.5; the anode 107 of the organic light-emitting diode 40 is made of a transparent conductive oxide material having a refractive index in a range of 1.6 to 2.1, and a thickness L of the second insulating layer satisfies a formula of $L=n1/2\lambda$. Further, the conductive layer is made of sliver (Ag) or aluminum neodymium alloy (AlNd), the second insulating layer 112 is made of silicon oxide ($SiO_2$), and the anode 107 of the organic light-emitting diode 40 is made of indium tin oxide or indium zinc oxide.

In the array substrate of the organic light-emitting display device in the related art shown in FIG. 1, as for the micro-cavity structures in the pixel units for different colors, frequencies of light emitted from the micro-cavity structures can be changed by adjusting thicknesses of respective anode layers, and in this way, the pixels for the three colored light need three anode layers of different thicknesses. And the three anode layers of different thicknesses need to be achieved by three different coating-exposing-etching processes. However, in the present disclosure, it is only needed to adjust the thickness of the second insulating layer 112 corresponding to the pixel units for different colors so that the micro-cavity structures can reflect light of different colors, and the second insulating layer 112 having different thicknesses can be obtained by a process including one coating, two of exposing and two of etching, so efficiency of a mask process may be improved.

Figure 5:
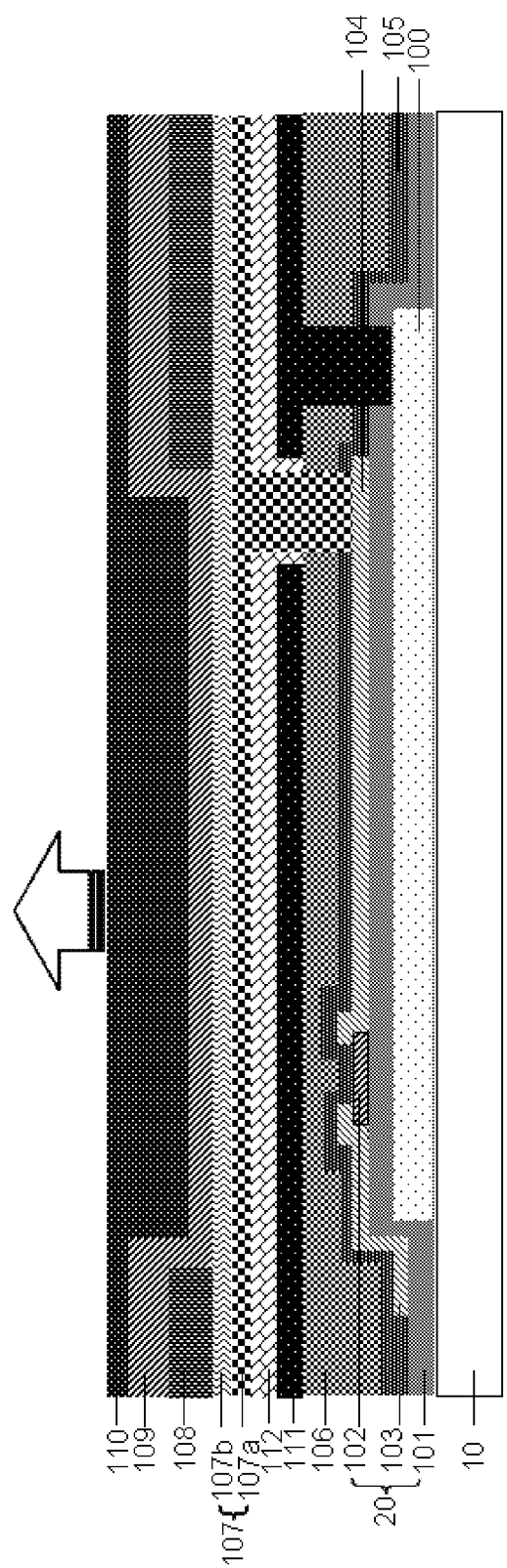
FIG. 5 is a partial cross-sectional structural schematic diagram of another example of a first electrode of an organic light-emitting diode in the array substrate of the organic light-emitting display device provided by the first embodiment of the present disclosure.

In a case of mainly considering magnitude of the capacitance, the array substrate of the organic light-emitting display device provided by the embodiment of the present disclosure may not adopt the micro-cavity structure. Thus, in an example, the conductive layer 111 may be made of a metal oxide material (e.g., ITO, IZO, IGZO, etc.), the anode 107 of the organic light-emitting diode 40 may include a metal reflecting layer 107a and a conductive metal oxide layer 107b (e.g., ITO, IZO), and as shown in FIG. 5, the conductive metal oxide layer 107b is formed on a side of the metal reflecting layer 107a opposite to the second insulating layer 112.

Second Embodiment

Figure 6:
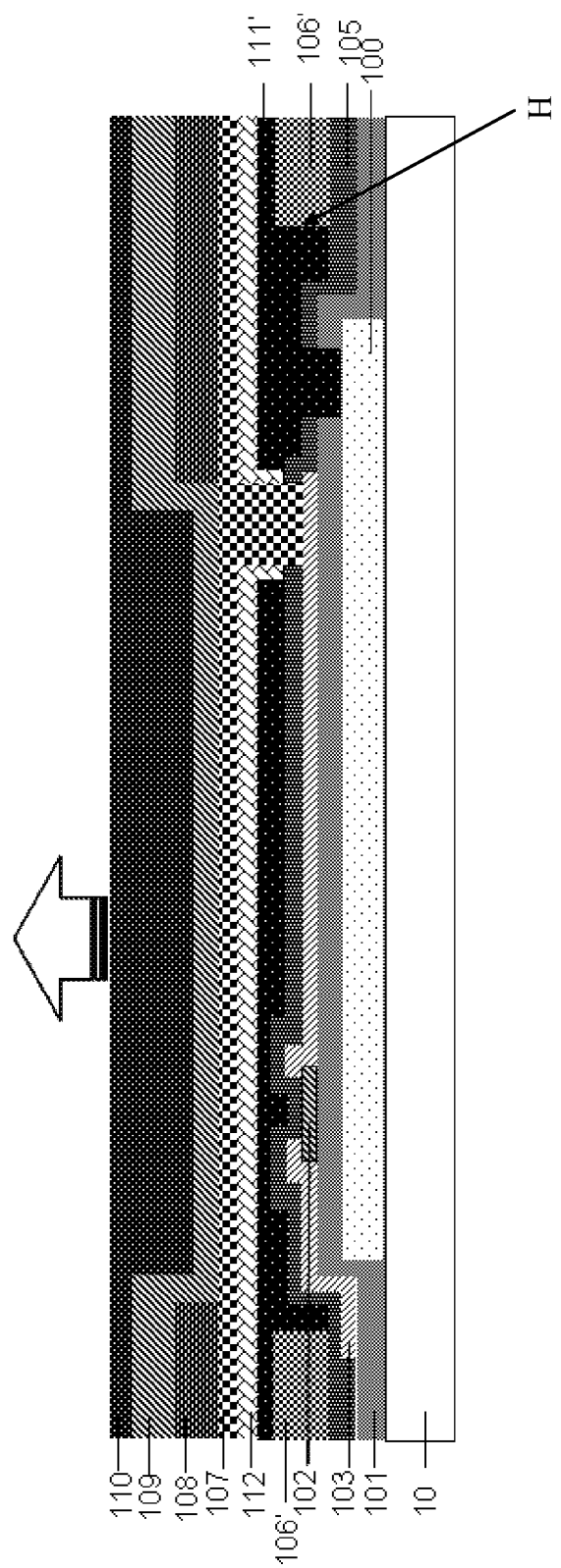
FIG. 6 is a partial cross-sectional structural schematic diagram of an array substrate of an organic light-emitting display device provided by a second embodiment of the present disclosure.

The second embodiment of the present disclosure provides an array substrate of an organic light-emitting display device, and FIG. 6 shows a partial cross-sectional structure thereof. As shown in FIG. 6, the array substrate may have a structure substantially same as that of the array substrate provided by first embodiment, except for a conductive layer 111' and a resin layer 106'. Therefore, description of the same components will be omitted here, and same or similar components are referred to by same or similar terms and same or similar reference signs.

Referring to FIG. 6, in an array substrate of an organic light-emitting display device provided by the second embodiment of the present disclosure, a resin layer 106' formed between the first thin film transistor 20 and the organic light-emitting diode 40 includes an opening H, and the opening H exposes a part of the first insulating layer 105 underneath. A vertical projection of the first gate electrode 100 of the first thin film transistor 20 on the base substrate 10, for example, is located within a vertical projection of the opening H of the resin layer 106' on the base substrate 10. At least a part of the conductive layer 111' is filled in the opening H, and in direct contact with the first insulating layer 105 exposed by the opening H. In addition, the conductive layer 111' passes through the first insulating layer 105 and the gate insulating layer 101 which are located underneath the bottom of the opening H and have a connection with the first gate electrode 100 of the first thin film transistor 20. Therefore, in the array substrate shown in FIG. 6, the first thin film transistor 20 is formed to have a dual-gate structure, that is, the first thin film transistor 20 has two gate electrodes: a bottom gate electrode 100 and a top gate electrode (i.e., a conductive layer 111'). As compared with the thin film transistor having single gate electrode, the thin film transistor having dual gate electrodes has better stability in threshold voltage, better output IV curve and better technical homogeneity.

In an example, the conductive layer 111' does not overlap with the gate line 11, the data line 12, the power line 13 or the gate electrode of the second thin film transistor 30, to reduce parasitic capacitance.

In the embodiments described above, the first thin film transistor 20 may be a thin film transistor of bottom-gate type or a thin film transistor of back channel etching type.

In the embodiments described above, the first thin film transistor 20 is an oxide thin film transistor, that is, an active layer of the first thin film transistor is an oxide active layer, for example, the oxide active layer is made of indium gallium zinc oxide (IGZO).

In an example, only the first thin film transistor 20 (the driving thin film transistor) is formed as an oxide thin film transistor having dual-gate structure, and the second thin film transistor 30 (the switching thin film transistor) is of a single-gate structure with a resin layer reserved thereabove. With regard to the display quality, the threshold voltage and output IV characteristic of the driving thin film transistor play a critical role while the influence from the switching thin film transistor is weak. Therefore, in the example, on one hand, the driving thin film transistor which is an oxide thin film transistor of dual-gate structure can improve the display quality of the organic light-emitting display device; on the other hand, the switching thin film transistor of a single-gate structure has a resin layer reserved thereabove so that parasitic capacitance will not be increased, and relatively small load can be maintained, that is, the two effects are achieved together.

Third Embodiment

The third embodiment of the present disclosure provides a fabrication method of an array substrate of an organic light-emitting display device. The array substrate of the organic light-emitting display device is the array substrate of the organic light-emitting display device provided by the first embodiment. Referring to FIG. 2 and FIG. 4, the fabrication method, for example, comprises:

Forming a first thin film transistor 20 in a pixel region on a base substrate 10, the pixel region being defined by a gate line 11 and a data line 12, wherein, the forming a first thin film transistor 20 includes forming a gate electrode 100, a gate insulating layer 101, an active layer 102 and a source electrode 103/a drain electrode 104 on the base substrate 10, sequentially;

Forming a first insulating layer 105, a planarization layer (e.g., a resin layer) 106, a conductive layer 111 and a second insulating layer 112 above the first thin film transistor 20, sequentially;

Forming an organic light-emitting diode 40 on the second insulating layer 112, wherein, the forming an organic light-emitting diode 40 includes sequentially forming an anode layer 107, a pixel defining layer 108, an organic light-emitting layer 109 and a cathode layer 110 on the base substrate 10 with the conductive layer 111 and the second insulating layer 112 formed thereon. Here, the organic light-emitting layer 109, for example, may include a hole transport layer (HTL), an emission layer (EL) and an electron transport layer (ETL) and so on.

Herein, the anode 107 of the organic light-emitting diode 40 passes through the second insulating layer 112, the resin layer 106 and the first insulating layer 105 to be electrically connected with the drain electrode 104 of the first thin film transistor 20; the conductive layer 111 passes through the resin layer 106, the first insulating layer 105 and the gate insulating layer 101 to be electrically connected with the gate electrode 100 of the first thin film transistor 20. The anode 107 of the organic light-emitting diode 40, the insulating layer 112 and the conductive layer 111 constitute a capacitor.

In an example, the conductive layer 11 covers the first thin film transistor 20 and at least a part of the data line 12.

In an example, the resin layer 106 has an opening H formed therein, a vertical projection of the first gate electrode 100 of the first thin film transistor 20 on the base substrate 10 is located within a vertical projection of the opening H on the base substrate 10, and at least a part of the conductive layer 111 is filled in the opening H.

The array substrate of the organic light-emitting display device fabricated by the method can effectively increase a storage capacitance value of a pixel unit and reduce leakage current, so that the display quality of the organic light-emitting display device can be improved.

Fourth Embodiment

The Fourth embodiment of the present disclosure provides an organic light-emitting display device, comprising any array substrate described above. The organic light-emitting display device may further include a packaging substrate opposed to the array substrate, and an adhesive film filled between the packaging substrate and the array substrate. The organic light-emitting display device may be: an OLED panel, a cell phone, a tablet computer, a television, a display device, a notebook computer, a digital photo frame, a navigator and any other products or parts with a display function. Because the display device comprises any array substrate described above, which can effectively increase a storage capacitance value of a pixel unit to reduce leakage current, the display device has excellent display quality.

Although the present disclosure is described in detail hereinbefore with general illustration and specific embodiments, based on the embodiments of the present disclosure, certain amendments or improvements can be made thereto, which is obvious for those skilled in the art. Therefore, the amendments or improvements made to the present disclosure without departing from the spirit of the present disclosure should be within the scope of the present disclosure.

The present application claims priority of Chinese Patent Application No. 201510201226.2 filed on Apr. 24, 2015, the present disclosure of which is incorporated herein by reference in its entirety as part of the present application.

The invention claimed is:

1. An array substrate of an organic light-emitting display device, comprising a pixel unit defined by a gate line, a source line and two data line, the pixel unit including:

an organic light-emitting diode and a first thin film transistor for controlling the organic light-emitting diode which are formed on a base substrate, wherein, the organic light-emitting diode includes a first electrode, a second electrode and a light-emitting layer located between the first electrode and the second electrode, the first electrode of the organic light-emitting diode being electrically connected with a drain electrode of the first thin film transistor; and a conductive layer and an insulating layer formed between the first thin film transistor and the organic light-emitting diode, wherein, the first electrode of the organic light-emitting diode, the insulating layer and the conductive layer form a capacitor, and the conductive layer is electrically connected with a first gate electrode of the first thin film transistor wherein, the conductive layer covers at least a part of one of the data lines, and each of the data lines has a substantially constant width.

2. The array substrate according to claim 1, wherein, the conductive layer covers the first thin film transistor.

3. The array substrate according to claim 1, wherein, the first thin film transistor is formed between the organic light-emitting diode and the base substrate.

4. The array substrate according to claim 3, wherein, an outer edge of a vertical projection of the conductive layer on the base substrate does not exceed an outer edge of a vertical projection of the first electrode of the organic light-emitting diode on the base substrate.

5. The array substrate according to claim 3, further comprising a planarization layer formed between the first thin film transistor and the conductive layer.

6. The array substrate according to claim 5, wherein the planarization layer is a resin layer, and has a thickness in a range of 1 to 2 microns.

7. The array substrate according to claim 1, wherein, the first electrode of the organic light-emitting diode, the insulating layer and the conductive layer form an optical resonant micro-cavity configured to generate a resonant enhancement for light having a wavelength of $\lambda$ emitted by the organic light-emitting diode and reflect the light out of the pixel unit.

8. The array substrate according to claim 7, wherein, the conductive layer is made of a metal or an alloy, the insulating layer has a refractive index n1 in a range of 1.4 to 1.5, the first electrode of the organic light-emitting diode is made of a transparent conductive oxide material having a refractive index in a range of 1.6 to 2.1, and a thickness L of the insulating layer satisfies a formula of $L=n1/2\lambda$.

9. The array substrate according to claim 8, wherein, the conductive layer is made of sliver or aluminum neodymium alloy, the insulating layer is made of silicon oxide, and the first electrode of the organic light-emitting diode is made of indium tin oxide or indium zinc oxide.

10. The array substrate according to claim 1, wherein, the first electrode of the organic light-emitting diode includes a metal reflecting layer and a conductive metal oxide layer, and the conductive metal oxide layer being formed on a side of the metal reflecting layer opposite to the insulating layer.

11. The array substrate according to claim 1, wherein, the first thin film transistor has a dual-gate structure, and conductive layer is configured to be a second gate different from the first gate of the first gate electrode transistor.

12. The array substrate according to claim 11, further comprising a planarization layer formed between the first thin film transistor and the conductive layer, wherein, the planarization layer includes an opening, a vertical projection of the first gate electrode of the first thin film transistor on the base substrate is located within a vertical projection of the opening on the base substrate, and at least a part of the conductive layer is filled in the opening.

13. The array substrate according to claim 1, wherein, the first electrode and the second electrode of the organic light-emitting diode are an anode and a cathode respectively.

14. The array substrate according to claim 1, wherein, the first thin film transistor is a thin film transistor of bottom-gate type or a thin film transistor of back channel etching type.

15. The array substrate according to claim 1, wherein, an active layer of the first thin film transistor is an oxide active layer.

16. An organic light-emitting display device, comprising the array substrate according to claim 1.

17. A fabrication method of an array substrate of an organic light-emitting display device, comprising:
    forming a first thin film transistor and an organic light-emitting diode in a pixel region on a base substrate, the pixel region being defined by a gate line, a source line and two data lines; and
    forming a conductive layer and an insulating layer between the first thin film transistor and the organic light-emitting diode; wherein, the organic light-emitting diode includes a first electrode, a second electrode and a light-emitting layer located between the first electrode and the second electrode, the first electrode of the organic light-emitting diode being electrically connected with a drain electrode of the first thin film transistor; the first electrode of the organic light-emitting diode, the insulating layer and the conductive layer form a capacitor, and the conductive layer is electrically connected with a first gate electrode of the first thin film transistor,
    wherein, the conductive layer covers at least a part of one of the data lines, and each of the data lines has a substantially constant width.

18. The fabrication method of the array substrate according to claim 17, wherein, the conductive layer covers the first thin film transistor.

19. The fabrication method of the array substrate according to claim 17, further comprising forming a planarization layer between the conductive layer and the organic light-emitting diode.

20. The fabrication method of the array substrate according to claim 19, wherein, the planarization layer has an opening, a vertical projection of the first gate electrode of the first thin film transistor on the base substrate is located within a vertical projection of the opening on the base substrate, and at least a part of the conductive layer is filled in the opening, so that the conductive layer forms a second gate different from the first gate of the first gate electrode transistor.

* * * * *